(12) United States Patent
Sandberg et al.

(10) Patent No.: US 11,025,275 B2
(45) Date of Patent: Jun. 1, 2021

(54) LDPC CODE BLOCK SEGMENTATION

(71) Applicant: Telefonaktiebolaget LM Ericsson (publ), Stockholm (SE)

(72) Inventors: Sara Sandberg, Luleå (SE); Mattias Andersson, Sundbyberg (SE); Yufei Blankenship, Kildeer, IL (US); Amirpasha Shirazinia, Solna (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 22 days.

(21) Appl. No.: 16/483,091

(22) PCT Filed: Feb. 6, 2018

(86) PCT No.: PCT/SE2018/050101
§ 371 (c)(1),
(2) Date: Aug. 2, 2019

(87) PCT Pub. No.: WO2018/143890
PCT Pub. Date: Aug. 9, 2018

(65) Prior Publication Data
US 2020/0235752 A1 Jul. 23, 2020

Related U.S. Application Data

(60) Provisional application No. 62/455,098, filed on Feb. 6, 2017.

(51) Int. Cl.
*H03M 13/11* (2006.01)
*H03M 13/09* (2006.01)
*H03M 13/00* (2006.01)

(52) U.S. Cl.
CPC ....... *H03M 13/1102* (2013.01); *H03M 13/09* (2013.01); *H03M 13/6393* (2013.01); *H03M 13/6516* (2013.01); *H03M 13/6522* (2013.01)

(58) Field of Classification Search
CPC ................................................. H03M 13/1102
(Continued)

(56) References Cited

U.S. PATENT DOCUMENTS

2001/0033582 A1* 10/2001 Sarkkinen ........... H04W 92/045
370/474
2014/0286282 A1* 9/2014 Jamadagni ........ H04W 36/0022
370/329
(Continued)

OTHER PUBLICATIONS

3GPP TS 36.212 v14.1.1; Technical Specification; 3rd Generation Partnership Project; Technical Specification Group Radio Access Network; Evolved Universal Terrestrial Radio Access (E-UTRA); Multiplexing and channel coding (Release 14)—Jan. 2017.
(Continued)

*Primary Examiner* — Fritz Alphonse
(74) *Attorney, Agent, or Firm* — Christopher & Weisberg, P.A.

(57) ABSTRACT

According to some embodiments, a method in a wireless transmitter comprises: receiving a plurality of bits for a wireless transmission; determining a maximum code block size for the transmission based on code rate, maximum code word size Nmax, and design parameters of the channel code; segmenting the plurality of bits into one or more code block segments such that no one of the one or more code block segments is larger than the determined maximum code block size; and transmitting the one or more code block segments to a wireless receiver. In particular embodiments, the design parameters of the channel code limit the maximum code block size to Kmax for any code rate. The determined maximum code block size may be limited by code rate and Nmax such that the maximum code block size does not exceed code rate times Nmax.

19 Claims, 7 Drawing Sheets

(58) Field of Classification Search
USPC .................................. 714/776, 778, 774, 775
See application file for complete search history.

(56) References Cited

U.S. PATENT DOCUMENTS

2019/0068224 A1* 2/2019 Li .................... H03M 13/1185
2019/0110225 A1* 4/2019 Edge .................... G01S 1/0428
2020/0021310 A1* 1/2020 Zheng ................ H03M 13/155

OTHER PUBLICATIONS

3GPP TSG RAN WG1 AH NR Meeting; Spokane, USA; Source: ZTE, ZTE Microelectronics; Title: Compact LDPC design for eMBB (R1-1700247)—Jan. 16-20, 2017.
3GPP TSG-RAN WG1#N4 Ad-Hoc meeting; Spokane, U.S.A.; Source: Nokia, Alcatel-Lucent Shanghai Bell; Title: Code segmentation for eMBB data (R1-1701029)—Jan. 16-20, 2017.
3GPP TSG-RAN WG1 #88; Athens, Greece; Source: Ericsson; Title: Code Block Segmentation for LDPC Codes (R1-1701629)—Feb. 13-17, 2017.
3GPP TSG RAN WG1 NR Ad-Hoc#2; Qingdao, P.R. China; Source: ZTE; Title: Consideration on coding chain for eMBB data channel (R1-1710844)—Jun. 27-30, 2017.
PCT International Search Report for International application No. PCT/SE2018/050101—dated Jul. 4, 2018.
PCT Written Opinion of the International Searching Authority for International application No. PCT/SE2018/050101—dated Jul. 4, 2018.
3GPP TSGRAN WG1 meeting #86bis; Lisbon, Portugal; Source: Spreadtrum Communications; Title: Code segmentation and CRC issues for LDPC codes (R1-1608921)—Oct. 10-14, 2016.
3GPP TSG RAN WG1 Meeting #87; Reno, USA; Source: Ericsson; Title: Design of LDPC Codes for NR (R1-1611321)—Nov. 14-18, 2016.
3GPP TSG-RAN WG1 Meeting #87; Reno, USA; Source: Nokia, Alcatel-Lucent Shanghai Bell; Title: Code segmentation for eMBB data (R1-1612282)—Nov. 14-18, 2016.
Extended European Search Report issued for Application No./ Patent No. 18748200.5-1210 / 3577768 PCT/SE2018050101— dated Oct. 26, 2020.

* cited by examiner

LDPC CODE BLOCK SEGMENTATION

PRIORITY

This nonprovisional application is a U.S. National Stage Filing under 35 U.S.C. § 371 of International Patent Application Serial No. PCT/SE2018/050101 filed Feb. 6, 2018 and entitled "LDPC CODE BLOCK SEGMENTATION" which claims priority to U.S. Provisional Patent Application No. 62/455,098 filed Feb. 6, 2017 both of which are hereby incorporated by reference in their entirety.

TECHNICAL FIELD

Particular embodiments are directed to wireless communications and, more particularly, to, low-density parity-check (LDPC) code block segmentation for new radio (NR).

BACKGROUND

Wireless networks, such as Third Generation Partnership Project (3GPP) long term evolution (LTE) networks, use channel coding schemes, such as turbo codes, for physical layer transmission. 5G networks, such as 3GPP New Radio (NR) developed to support such requirements as enhanced mobile broadband (eMBB), may use other channel coding schemes, such as low-density parity check (LDPC).

LDPC codes are linear block codes, which are described via a sparse parity-check matrix (PCM) of size M×N, where the rows and columns of the PCM correspond to check nodes and variable nodes, respectively. The LDPC code rate is defined as R=K/N, where K denotes information block size of one codeword and N denotes the number of transmitted bits.

An important class of LDPC codes are quasi-cyclic (QC) LDPC codes. The PCM H of a QC-LDPC code can be represented by a base matrix of size $m_b$=M/Z and $n_b$=N/Z, and a lifting factor Z. QC PCMs are partitioned into square sub-blocks (sub-matrices) of size Z×Z. These submatrices are either null submatrices or sums of cyclic-permutations of the identity matrix. More precisely, the cyclic-permutation matrix Pi is obtained from the Z×Z identity matrix by cyclically shifting the columns to the right by i elements. The matrix P0 is the Z×Z identity matrix. Quasi-cyclic LDPC codes are conveniently described through a base matrix, which is a matrix where each integer i denotes the cyclic-permutation matrix Pi and an entry with a set of integers denotes the sum of the corresponding cyclic permutation matrices. Entries with i=−1 in the matrix denote null (zero) submatrices.

Figure 1:
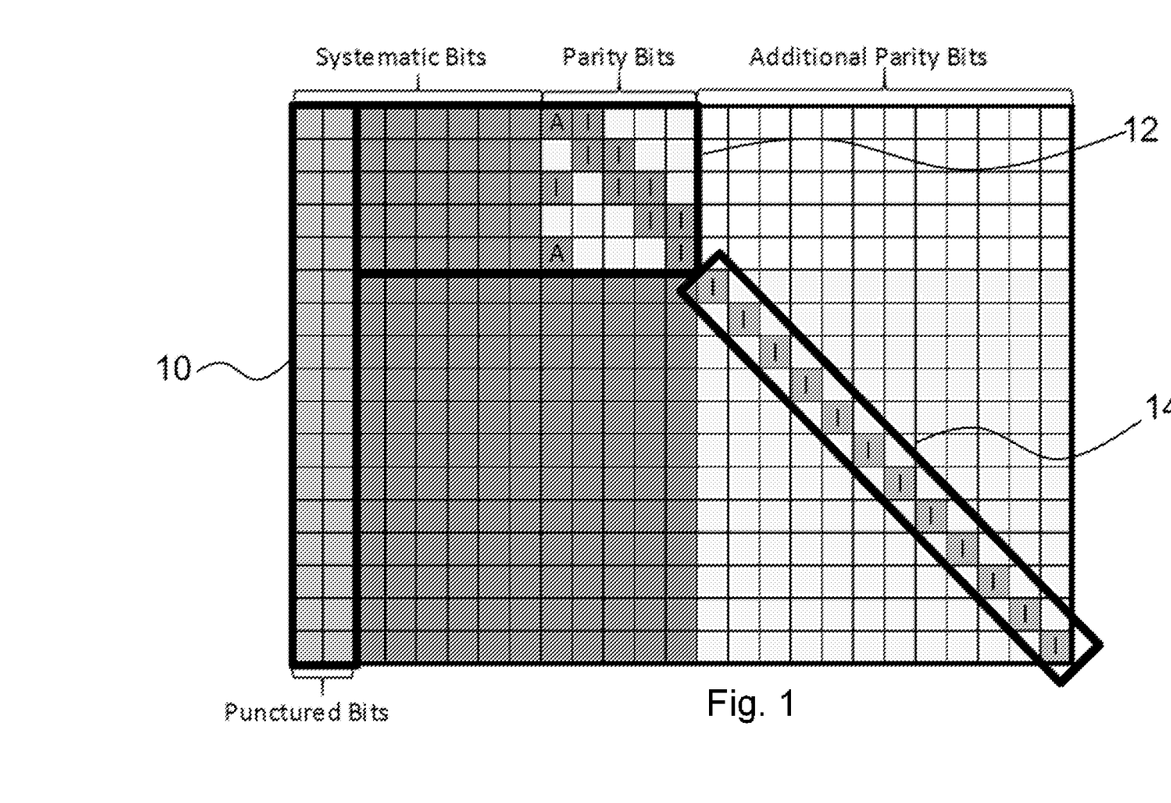
FIG. 1 is an illustration of an example LDPC code structure.

FIG. 1 is an illustration of an example LDPC code structure. Particularly, FIG. 1 illustrates the basic structure of the parity check matrix (PCM) H Each square corresponds to a sub-block of size Z×Z. 3GPP specifies that the LDPC codes used for eMBB data in NR will have this structure. The first $N_{sys,punc}$ systematic information bits are always punctured (the set of bits corresponding to region 10 of the PCM). This structure reduces the threshold of the code. $N_{sys,punc}$ can be for example 0, Z or 2×Z bits.

Some of the remaining systematic bits are always transmitted, while some of them may be shortened if an information block length $K_{tx}$, with $K_{tx}$<K, is desired, where K is the native information block length of the PCM. Submatrices from the upper left correspond to codes with a high rate. The rate may be reduced by transmitting additional parity bits from the incremental redundancy part, as described by the rightmost part of the matrix.

This feature provides a degree of freedom to choose code rates between $R_{min}$ (minimum supported code rate) and $R_{max}$ (maximum supported code rate) that are achieved through code extension. In case of shortening, or a desired code rate higher than the highest design rate, some of the parity bits (the shaded parity bits in region 12) can be punctured.

LDPC codes may be optimized for any block length and/or any code rate. However, using different PCMs for each alternative of block lengths and rates is not efficient in practical communication systems. Instead, rate matching is implemented through shortening, puncturing, and repetition.

Shortening is a technique to obtain codes of shorter length and lower rate from a given LDPC mother code by fixing the value of some information bits to some known values (usually '0') when encoding, whose positions are assumed to be available to both encoder and decoder. In the decoding process, the fixed bits are given infinite reliability. Puncturing, on the other hand, is a technique where some coded bits are not transmitted, which increases the code rate of a given LDPC code. Repetition simply means that some of the coded bits are repeated and transmitted more than once.

CRC attachment may be modified for NR. NR may attach CRC on code-block group level in addition to, or instead of, attaching CRC on code-block level. A code-block group is a set of one or more code blocks. If CRC bits are attached on CBG level, $L_{CBG}$ CRC bits are added to the information bits corresponding to the code blocks in the CBG. The $L_{CBG}$ CRC bits may be transmitted together with any of the code blocks in the group, or spread out over several of the code blocks in the group.

Code block segmentation (CBS) is a procedure commonly applied before channel coding/rate matching processes in the physical layer. In fact, when the transport block size (TBS) exceeds some threshold supported by the encoder, the transport block has to be segmented into multiple blocks whose sizes are supported by the channel coding scheme. CBS is used to prevent increasing the complexity and memory burden of the decoding algorithm.

In the LTE standard (3GPP TS 36.212 V14.1.1, Section 5.1.2), CBS is performed when the information block length (i.e., the length of the transport block including L additional CRC (cyclic redundancy check) bits) exceeds the maximum code block size of $K_{max}$=6144 bits prior to Turbo encoding. CBS will segment the information block into smaller code blocks. More specifically, if TBS+L is larger than the maximum number of information bits that the channel code can handle (i.e., $K_{max}$=6144), then segmentation of the input bit sequence is performed, and an additional CRC sequence of L=24 bits is attached to each code block. An example is illustrated in FIG. 2.

Figure 2:
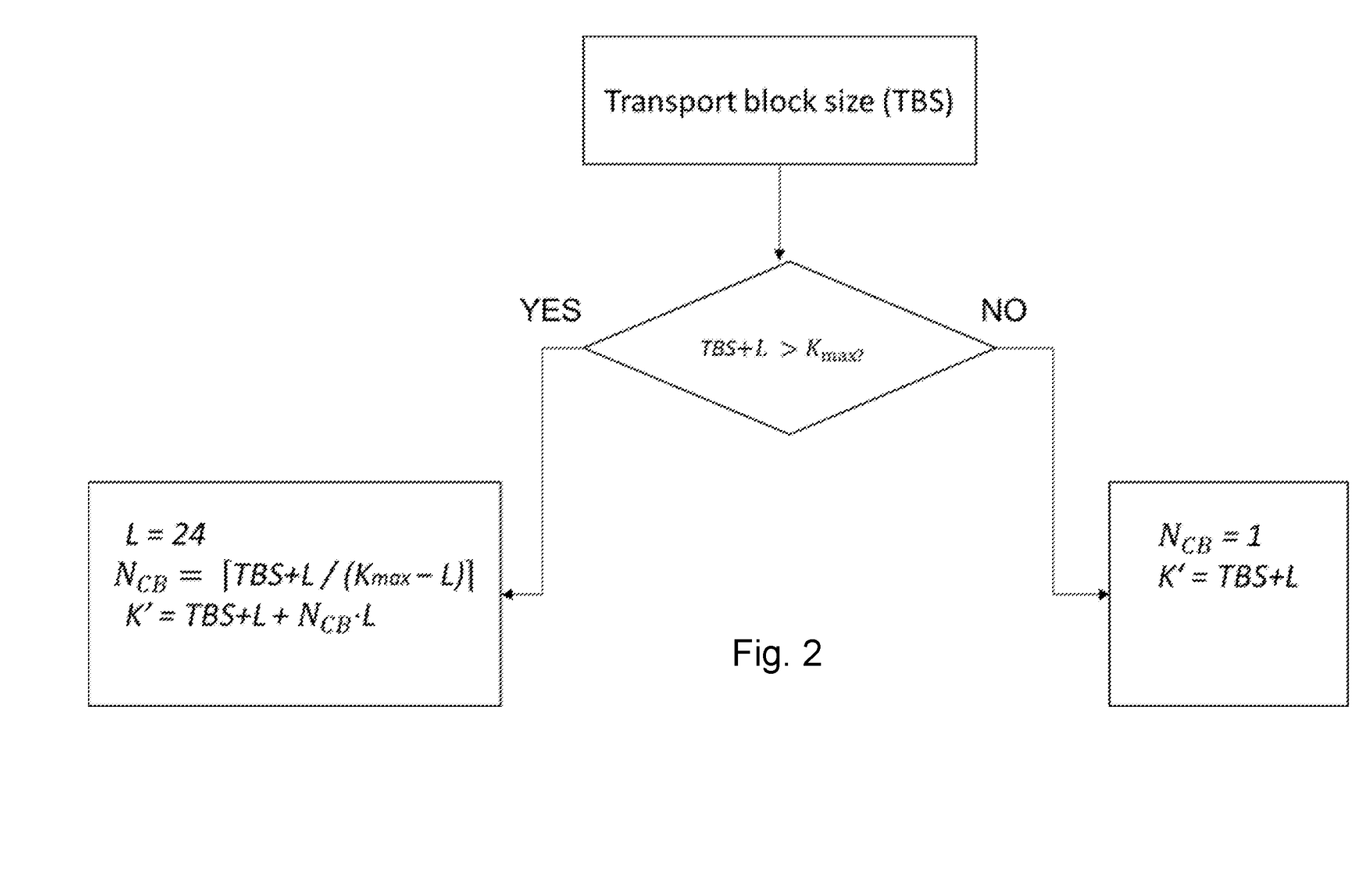
FIG. 2 is a flowchart of the CBS process in LTE.

FIG. 2 is a flowchart of the CBS process in LTE. The flowchart illustrates how the total number of code blocks, denoted by $N_{CB}$, and new total block size, denoted by K', are determined.

CBS is also performed for other wireless standards, such as IEEE 802.11n (IEEE Std 802.11 2012, Part 11: Wireless LAN Medium Access Control).

CBS in 802.11n is somewhat different from CBS in LTE. For example, to encode an LDPC data unit, the first step is the code block segmentation procedure described as follows. First, the process computes the number of available bits, $N_{avbits}$, in the minimum number of modulated symbols in which the data field of the packet may fit.

$$N_{avbits} = c \times \left\lceil \frac{TBS}{c \times R} \right\rceil$$

where K is payload length (i.e., information block size), and c is a constant depending on space time block code parameter, etc. The payload size is denoted by $N_{pid}$ in the 802.11n standard, but for the sake of consistency we use the TBS notation herein.

Then, based on the range of $N_{avbits}$, the number of LDPC code blocks (number of segments), and LDPC codeword length (segment size) are calculated according to Table 1

TABLE 1

Code block segmentation parameters in 802.11n

| Range of $N_{avbits}$ (bits) | Number of LDPC code blocks (CBs) | LDPC codeword length (bits) |
|---|---|---|
| $N_{avbits} \leq 648$ | 1 | 1296, if $N_{avbits} \geq$ TBS + 912 × (1 − R) 648, otherwise |
| $648 < N_{avbits} \leq 1296$ | 1 | 1944, if $N_{avbits} \geq$ TBS + 1464 × (1 − R) 1296, otherwise |
| $1296 < N_{avbits} \leq 1944$ | 1 | 1944 |
| $1944 < N_{avbits} \leq 2592$ | 2 | 1944, if $N_{avbits} \geq$ TBS + 2916 × (1 − R) 1296, otherwise |
| $2592 < N_{avbits}$ | $\left\lceil \dfrac{TBS}{1944 \times R} \right\rceil$ | 1944 |

One problem with existing solutions is that if the code block segmentation procedure is based on the maximum information block length Kmax that the decoder can handle, as in LTE, hardware must be provisioned for a maximum codeword block length corresponding to the maximum information block size combined with the lowest code rate, which gives the largest possible codeword block size. However, this combination is rarely used in practice. Thus, the hardware area efficiency for other, more often used, combinations of information block length and code rate is low when hardware is provisioned for this case.

The code block segmentation procedure used in 802.11n is more suited for LDPC codes. However, it is based on the twelve different combinations of info block size and code rate that are available in 802.11n and is not applicable to the LDPC codes proposed for NR.

The alternatives described in the Background section are not necessarily alternatives that have been previously conceived or pursued. Therefore, unless otherwise indicated herein, the alternatives described in the Background section are not prior art and are not admitted to be prior art by inclusion in the Background section.

SUMMARY

The embodiments described herein include methods and apparatus for code block segmentation based on the structure and design parameters of the low-density parity-check (LDPC) codes proposed for fifth generation (5G) new radio (NR). In particular embodiments, given a fixed maximum codeword length Nmax, which the LDPC decoder hardware is provisioned to support, the code block segmentation method divides the information bits of the transport block into code blocks based on desired code rate and the minimum code rate that the LDPC code has been extended to.

According to some embodiments, a method in a wireless transmitter comprises: receiving a plurality of bits for a wireless transmission; determining a maximum code block size for the transmission based on code rate, maximum code word size Nmax, and design parameters of the channel code; segmenting the plurality of bits into one or more code block segments such that no one of the one or more code block segments is larger than the determined maximum code block size; and transmitting the one or more code block segments to a wireless receiver.

In particular embodiments, the design parameters of the channel code limit the maximum code block size to Kmax for any code rate. The determined maximum code block size may be limited by code rate and Nmax such that the maximum code block size does not exceed code rate times Nmax. The code rate may be the maximum of the minimum code rate for which the channel code is designed and the target code rate.

In particular embodiments, Nmax may be adjusted by subtraction of the number of punctured systematic bits. The determined maximum code block size may be further adjusted by subtracting the length of the CRC attached to each code block. Segmenting the plurality of bits may further comprise allowing code block segments with a maximum code block size larger than the determined maximum code block size as long as the code block segment size does not exceed Kmax.

In particular embodiments, the wireless transmitter comprises a network node or a wireless device.

According to some embodiments, a wireless transmitter comprises processing circuitry. The processing circuitry is operable to: receive a plurality of bits for a wireless transmission; determine a maximum code block size for the transmission based on code rate, maximum code word size Nmax, and design parameters of the channel code; segment the plurality of bits into one or more code block segments such that no one of the one or more code block segments is larger than the determined maximum code block size; and transmit the one or more code block segments to a wireless receiver.

In particular embodiments, the design parameters of the channel code limit the maximum code block size to Kmax for any code rate. The determined maximum code block size may be limited by code rate and Nmax such that the maximum code block size does not exceed code rate times Nmax. The code rate may be the maximum of the minimum code rate for which the channel code is designed and the target code rate.

In particular embodiments, the wireless transmitter comprises a network node or a wireless device.

According to some embodiments, a wireless transmitter comprises a receiving module, a determining module, a segmenting module, and a transmitting module. The receiving module is operable to receive a plurality of bits for a wireless transmission. The determining module is operable to determine a maximum code block size for the transmission based on code rate, maximum code word size Nmax, and design parameters of the channel code. The segmenting module is operable to segment the plurality of bits into one or more code block segments such that no one of the one or more code block segments is larger than the determined maximum code block size. The transmitting module is operable to transmit the one or more code block segments to a wireless receiver.

Also disclosed is a computer program product. The computer program product comprises instructions stored on non-transient computer-readable media which, when executed by a processor, perform the steps of: receiving a plurality of bits for a wireless transmission; determining a maximum code block size for the transmission based on code rate, maximum code word size Nmax, and design parameters of the channel code; segmenting the plurality of bits into one or more code block segments such that no one of the one or more code block segments is larger than the determined maximum code block size; and transmitting the one or more code block segments to a wireless receiver.

Particular embodiments may exhibit some of the following technical advantages. For example, by applying the code block segmentation scheme of particular embodiments, the maximum codeword length that the hardware is provisioned for is used more often. When limiting Nmax to a value smaller than Kmax divided by the minimum code rate supported by the channel code, the area efficiency of the decoder increases. Another advantage is that with a given maximum codeword length, the block error rate (BLER) performance of the LDPC codes is increased because the average codeword length is increased with the code block segmentation scheme of particular embodiments. Other technical advantages will be readily apparent to one skilled in the art from the following figures, description and claims.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Fifth generation (5G) networks, such as Third Generation Partnership Project (3GPP) New Radio (NR), that support requirements such as enhanced mobile broadband (eMBB), may use channel coding schemes such as low-density parity check (LDPC). One problem with using LDCP with existing solutions is that if the code block segmentation procedure is based on the maximum information block length $K_{max}$ that the channel code is designed for, like in long term evolution (LTE), hardware must be provisioned for a maximum codeword block length corresponding to the maximum information block size combined with the lowest code rate, which gives the largest possible codeword block size. However, this combination is rarely used in practice. Thus, the hardware area efficiency for other, more often used, combinations of information block length and code rate is low when hardware is provisioned for this case.

Particular embodiments obviate the problems described above and include code block segmentation based on the structure and design parameters of the LDPC codes proposed for NR. In particular embodiments, given a fixed maximum codeword length, which the LDPC decoder hardware is provisioned to support, the code block segmentation method divides the information bits of the transport block into code blocks based on desired code rate and the minimum code rate that the LDPC code has been extended to.

For example, by applying the code block segmentation scheme of particular embodiments, the maximum codeword length Nmax that the hardware is provisioned for is used more often. The area efficiency of the decoder is thereby higher. Another advantage is that with a given maximum codeword length, the block error rate (BLER) performance of the LDPC codes is increased because the average codeword length is increased with the CBS scheme of particular embodiments.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 3-7B of the drawings, like numerals being used for like and corresponding parts of the various drawings. LTE and NR are used throughout this disclosure as an example cellular system, but the ideas presented herein may apply to other wireless communication systems as well.

Figure 3:
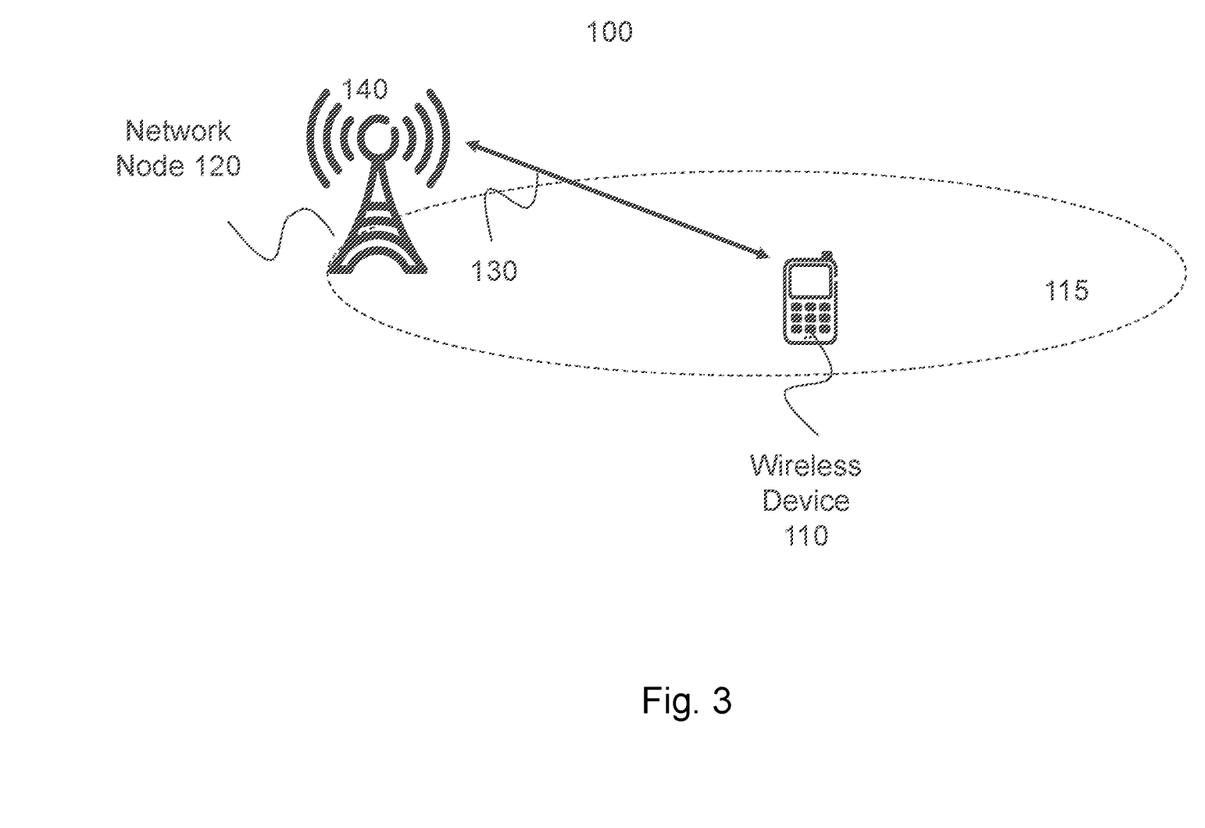
FIG. 3 is a block diagram illustrating an example wireless network, according to some embodiments.

FIG. 3 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter 140 or multiple transmitters 140 for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless signals 130 may be encoded with LDPC codes such as those described with respect to FIG. 1. For example, a wireless transmitter, such as network node 120 and wireless device 110, may calculate a maximum code block size for each transmission based on code rate, maximum code word size Nmax, and design parameters of the channel code. the wireless transmitter may perform code block segmentation such that no code block is larger than the calculated maximum code block size. Particular algorithms for performing code block segmentation are described in more detail with respect to FIGS. 4 and 5.

In wireless network 100, each network node 120 may use any suitable radio access technology, such as long term evolution (LTE), LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 6A below. Similarly, a network node may include any suitable combination of hardware and/or software. For example, in particular embodiments, a network node, such as network node 120, may include the components described with respect to FIG. 7A below.

In particular embodiments, a code block segmentation (CBS) scheme for NR is based on a maximum codeword length Nmax (supported by LDPC decoder hardware) and minimum code rate of the LDPC encoder. In general, large code blocks may be used if the desired code rate is fairly high (e.g., rate ⅓ or higher) while the transport block may be divided into shorter segments if the desired code rate is lower. The size of the code blocks is calculated from the maximum codeword length, the maximum allowed code block length, and the desired code rate.

The following notations are used herein:
TBS: Transport block size
$L_{TB}$: Number of CRC bits attached on transport block level
$L_{CB}$: Number of CRC bits attached on code block level
$K_{max}$: Maximum number of information bits supported by the channel code
K: Code block size
R: Desired code rate
$R_{min}$: Minimum code rate supported by LDPC encoder via code extension for information block size K<$K_{max}$, as long as $N_{max}$ is not exceeded.
$N_{max}$: Maximum codeword length supported by the LDPC decoder hardware
$N_{CB}$: Number of code blocks in this transmission
$N_{sys,punc}$: Number of punctured systematic information bits $K_{CB,max}$: Maximum code block size to use in the code block segmentation
$K_{CB,j}$: Size of code block j before code-block level CRC bits are attached Based on these notations, the number of code blocks and the code block sizes are calculated as follows:

1) Calculate the minimum code rate $R_{min,Kmax}$ that can be supported for the largest code block size $K_{max}$, $$R_{min,Kmax} = \frac{K_{max}}{N_{max} - N_{sys,punc}}$$

Note that the minimum code rate $R_{min,Kmax}$ can be pre-defined, thus it is not required to be calculated for each TB.

Here, $N_{sys,punc}$ corresponds to the number of systematic punctured bits for the maximum Z.

2) If R≥$R_{min,Kmax}$, then code block segmentation is limited by $K_{max}$, and $K_{CB,max}$=$K_{max}$-$L_{CB}$. Otherwise, code block segmentation is limited by $N_{max}$, and $K_{CB,max}$=max($R_{min}$,R)·($N_{max}$-$N_{sys,punc}$)-$L_{CB}$.

In principle, $N_{sys,punc}$ depends on K and the Z-value used for that K. For simplicity, $N_{sys,punc}$ may be calculated for $Z_{max}$ instead of the actual Z.

In the above, the desired code rate R is calculated based on several factors including: (a) transport block size TBS; (b) allocated physical resource blocks in time-frequency domain; (c) the modulation order indicated for the given TBS; (d) the number of MIMO layers indicated for the given TB.

3) If TBS+$L_{TB}$>$K_{CB,max}$+$L_{CB}$, the number of code blocks and the size of each code block, before the code-block level CRC is attached, is determined by $$N_{CB} = \left\lceil \frac{TBS + L_{TB}}{K_{CB,max}} \right\rceil$$

$$K_{CB,j} = \left\lfloor \frac{TBS + L_{TB}}{N_{CB}} \right\rfloor + A_j$$

where $A_j$ is 0 or 1 and is added to some of the code blocks to account for the downward rounding such that $$\sum_{j=1}^{N_{CB}} K_{CB,j} = TBS + L_{TB}.$$

The total number of $A_j$ with value 1 is:

$$J = TBS + L_{TB} - N_{CB} \cdot \left\lfloor \frac{TBS + L_{TB}}{N_{CB}} \right\rfloor$$

A simple way is to assign $A_1, A_2, \ldots A_J$ value 1, while assigning $A_{J+1}, A_{J+2}, \ldots A_{N_{CB}}$ value 0.

If TBS+$L_{TB}$≤$K_{CB,max}$+$L_{CB}$, then code block segmentation is not required, thus:

$$N_{CB}=1$$

$$K_{CB,1}=TBS+L_{TB}$$

Figure 4:
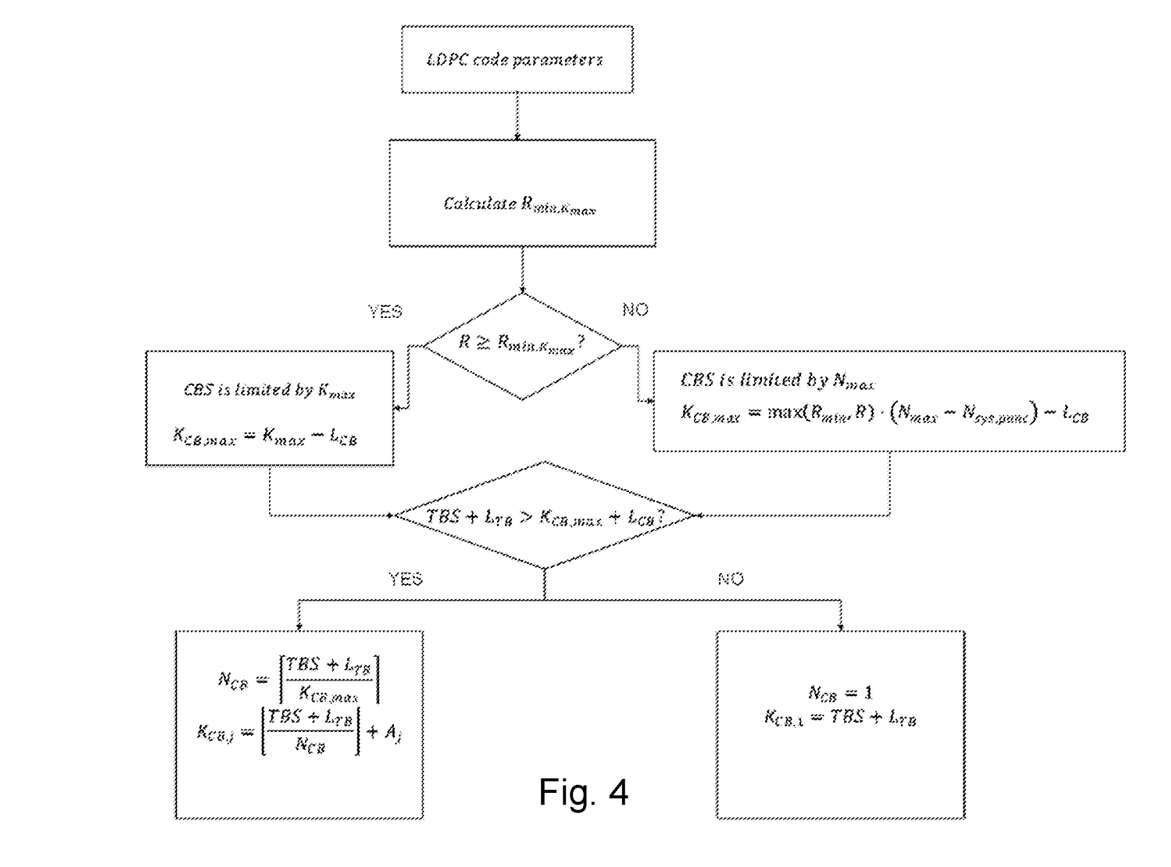
FIG. 4 is a flowchart of an example CBS procedure for NR, according to some embodiments.

FIG. 4 is a flowchart of an example CBS procedure for NR. FIG. 4 graphically illustrates the algorithm described above. Starting with the transport block size, the method determines whether the transport block size plus CRC bits is larger than the largest code block size. If so, segmentation is performed according to the algorithms described herein.

In particular embodiments, having max($R_{min}$, R), instead of R alone, accounts for the minimum code rate $R_{min}$ that can be achieved through code extension for the specific LDPC code. Any code rates lower than $R_{min}$ may be achieved through repetition and may therefore not be included in the calculation of the codeword length. After encoding, but before transmission, rate-matching (for example based on a circular buffer as in LTE) may be used to achieve the desired code rate and block length.

Some embodiments use repetition to reduce the number of code blocks. For example, some embodiments use $$C \cdot K_{CB,max} < TBS + L_{TB} \leq C \cdot K_{CB,max} + \Delta K$$

where C is an integer and $\Delta K$ is a threshold which is small compared to $K_{CB,max}$. This results in C+1 code blocks with the code block segmentation method described above, because the desired code rate R cannot be achieved through code expansion within C code blocks. However, if a small amount of repetition, instead of code extension, is allowed for cases like this, the number of code blocks can be reduced to C instead of C+1 and the code block length may be larger, resulting in improved BLER performance. Example 3 described in more detail below is an example of performing repetition to reduce the number of code blocks and thereby increase the code block size.

Particular embodiments may calculate the total codeword length as seen by a layered decoder. For quasi-cyclic LDPC codes, a layered decoder handles blocks of Z bits in parallel. If the number of parity bits or information bits is not a factor of Z, the decoder may have to handle additional punctured or shortened bits to make the number of bits a factor of Z. This may be accounted for already in the code block segmentation method or can simply be ignored and instead handled by using repetition of some bits to ensure that the total codeword length does not exceed $N_{max}$.

To ensure that the number of information bits plus shortened bits do not exceed the allowed number of information bits calculated from $N_{max}$ and R, $K_{CB,max}$ may be decreased to the largest possible value which can be written as an integer times Z. By doing so, the probability that $N_{max}$ is exceeded is reduced and it is less likely that repetition is needed to achieve the desired code rate.

Another alternative is to increase $K_{CB,max}$ to the next value which can be written as an integer times Z. This increases the probability that repetition is needed, but also allows larger code blocks that may result in better BLER performance.

The following examples describe in more detail the CBS method of particular embodiments. While 24-bit TB-level CRC, $L_{TB}$=24, and 12-bit code-block level CRC, $L_{CB}$=12, is assumed in the examples below, it is understood that other values of $L_{TB}$ and $L_{CB}$ may be used by other embodiments and that the same methodology can be applied.

Example 1 is an example where code block segmentation is not needed. Let the transport block size be TBS=5000 bits. To the transport block, $L_{TB}$=24 CRC bits are attached. The desired code rate is R=1/10 for the given transport block. In terms of LDPC code construction, the minimum code rate achieved through code extension is $R_{min}$=1/5. The maximum codeword length handled by the decoder is $N_{max}$=30000 bits and the number of punctured systematic information bits is $N_{sys,punc}$=100. Furthermore, the decoder is only provisioned to handle a maximum of $K_{max}$=8192 information bits, due to a limitation of the maximum Z. $L_{CB}$=12 CRC bits should be attached to each code block.

1) The minimum code rate $R_{min,Kmax}$ that can be supported for the largest code block size $K_{max}$ is $$R_{min,Kmax} = \frac{K_{max}}{N_{max} - N_{sys,punc}} = \frac{8192}{30000 - 100} \approx 0.274$$

2) $R \leq R_{min,Kmax}$ and code block segmentation is limited by $N_{max}$ $$K_{CB,max} = \max(R_{min}, R) \cdot (N_{max} - N_{sys,punc}) - L_{CB} = \max(0.2, 0.1)$$

$$(30000-100) - 12 = 5968$$

3) TBS $L_{TB}$=5000+24=5024<$K_{CB,max}$+$L_{CB}$=5968+12=5980 and no code block segmentation is performed.

Example 2 is similar to example 1, but describes a case where code block segmentation is needed. In example 2, let the transport block size be TBS=60000 bits. To the transport block, $L_{TB}$=24 CRC bits are attached. The desired code rate R=1/10 and the minimum code rate achieved through code extension is $R_{min}$=1/5. The maximum codeword length handled by the decoder is $N_{max}$=30000 bits, the number of punctured systematic information bits is $N_{sys,punc}$=100 and $K_{max}$=8192 information bits. $L_{CB}$=12 CRC bits should be attached to each code block.

1) The minimum code rate $R_{min,Kmax}$ that can be supported for the largest code block size $K_{max}$ is $$R_{min,Kmax} = \frac{K_{max}}{N_{max} - N_{sys,punc}} = \frac{8192}{30000 - 100} \approx 0.274$$

2) $R \leq R_{min,Kmax}$ and code block segmentation is limited by $N_{max}$ $$K_{CB,max} = \mathrm{MaX}(R_{min}, R) \cdot (N_{max} - N_{sys,punc}) - L_{CB} = \max$$
$$(0.2, 0.1) \cdot (30000 - 100) - 12 = 5968$$

3) TBS+$L_{TB}$=60000+24=60024>$K_{CB,max}$+$L_{CB}$=5968+12=5980 which indicates that code block segmentation should be performed.

The number of code blocks and the size of each code block, before the code-block level CRC is attached, is determined by $$N_{CB} = \left\lceil \frac{TBS + L_{TB}}{K_{CB,max}} \right\rceil = \left\lceil \frac{60024}{5968} \right\rceil = \lceil 10.058 \rceil = 11$$

$$K_{CB,j} = \left\lfloor \frac{TBS + L_{TB}}{N_{CB}} \right\rfloor + A_j = \left\lfloor \frac{60024}{11} \right\rfloor + A_j = 5456 + A_j$$

where $A_j$ is 0 or 1. Assuming that $A_j$ is 0, then $$\sum_{j=1}^{N_{CB}} K_{CB,j} = 11 \cdot 5456 = 60016$$

By adding one bit to some of the code blocks starting from the first, i.e. $A_j=1$ for $1 \leq j \leq 8$, then the correct number of information bits is $$\sum_{j=1}^{N_{CB}} K_{CB,j} = 8 \cdot 5457 + 3 \cdot 5456 = 60024$$

Example 3 is an example where code block segmentation can be avoided through the use of repetition. Let the transport block size be TBS=7000 bits. To the transport block, $L_{TB}=24$ CRC bits are attached. The desired code rate $R=0.234$ and the minimum code rate achieved through code extension is $R_{min}=\frac{1}{5}$. The maximum codeword length handled by the decoder is $N_{max}=30000$ bits, the number of punctured systematic information bits is $N_{sys,punc}=100$ and $K_{max}=8192$ information bits. $L_{CB}=12$ CRC bits should be attached to each code block. Repetition may be used to reduce the number of segments if the constraint is fulfilled for $\Delta K=50$.

1) The minimum code rate $R_{min,Kmax}$ that can be supported for the largest code block size $K_{max}$ is $$R_{min,Kmax} = \frac{K_{max}}{N_{max} - N_{sys,punc}} = \frac{8192}{30000 - 100} \approx 0.274$$

2) $R<R_{min,Kmax}$ and code block segmentation is limited by $N_{max}$ $K_{CB,max} = \max(R_{min},R) \cdot (N_{max}-N_{sys,punc}) - L_{CB} = \max(0.2, 0.234) \cdot (30000-100) - 12 = 6985$ $TBS+L_{TB} = 7000+24 = 7024 > K_{CB,max}+L_{CB} = 6985+12 = 6997$ which indicates that code block segmentation must be performed. However, checking the constraint $C \cdot K_{CB,max} < TBS+L_{TB}-L_{CB} \leq C \cdot K_{CB,max}+\Delta K$ finds that for C=1, the constraint is fulfilled and repetition may be used to avoid code block segmentation.

The number of code blocks and the size of each code block, before the code-block level CRC is attached, is determined by $$N_{CB} = \left\lceil \frac{TBS+L_{TB}}{K_{CB,max}} \right\rceil = \left\lceil \frac{7024}{6985} \right\rceil = \lceil 1.0056 \rceil = 2$$

$K_{CB} = TBS + L_{TB} = 7024$

Because the constraint above is fulfilled, this example will round downwards instead of upwards to $N_{CB}=1$, which means that code block segmentation is not performed. The desired code rate is R=0.234. Calculating the code rate achieved through code extension for this specific case reveals that the impact of the avoided code block segmentation in terms of increased code rate achieved through code extension ($R_{ext}$) is minor:

$$R_{ext} = \frac{K_{CB}}{N_{max} - N_{sys,punc}} = \frac{7024}{30000 - 100} \approx 0.2349$$

To achieve the desired code rate for this specific case, $N_{rep}$ bits have to be repeated, where $N_{rep} = K_{CB} - \max(R_{min},R) \cdot (N_{max}-N_{sys,punc}) = 7024 - 0.234 \cdot 29900 \approx 27$.

In particular embodiments, each CB group (CBG) may be attached with a predefined number of $L_{CBG}$ CBG-level CRC bits. For NR, it may be possible to attach CRC on code-block group level in addition to, or instead of, attaching CRC on code-block level. A more general description of the code block segmentation method of particular embodiments accounts for both $L_{TB}$ CRC bits added on TB-level, $L_{CB}$ CRC bits added on code-block level and $L_{CBG}$ CRC bits added on code-block group level. The $L_{CBG}$ CRC bits added on code-block group level are attached to each of a maximum of $N_{CBG}$ code-block groups. Note that setting $N_{CBG}=0$ and $L_{CBG}=0$ is equivalent to the CBS approach described earlier.

Step 1) for calculation of the minimum code rate, $R_{min,Kmax}$ is the same as in the less general description above, because this is independent of the CRC attachments.

Step 2) for calculation of the maximum code block size, $K_{CBmax}$ to use in code block segmentation is also performed as before. The $L_{CB}$ CRC bits that are attached on code-block level are accounted for in the calculation of $K_{CBmax}$, because these CRC bits must be included in each code block. The $L_{TB}$ CRC bits added on TB-level and the $L_{CBG}$ CRC bits added on code-block group level are accounted for in step 3) below 3) If $TBS+L_{TB}+N_{CBG} \cdot L_{CBG} > K_{CB,max}+L_{CB}$, the number of code blocks and the size of each code block, before the code-block level CRC is attached, is determined by the following.

a. Calculate the number of CBs:

$$N_{CB} = \left\lceil \frac{TBS+L_{TB}+N_{CBG} \cdot L_{CBG}}{K_{CB,max}} \right\rceil$$

b. If $N_{CBG} < N_{CB}$, calculate the number of CBs per CB group:

$$M_1 = \left\lceil \frac{N_{CB}}{N_{CBG}} \right\rceil, M_2 = \text{remainder}(N_{CB}, N_{CBG})$$

The first $M_2$ CB groups is composed of $M_1$ CBs, the next $(N_{CBG}-M_2)$ groups are composed of $(M_1-1)$ CBs. Attach $L_{CB}$ CRC bits to each code block and attach $L_{CBG}$ CRC bits to each CBG.

Otherwise, each CBG is composed of a single CB. That is, CBG is degenerated to be equal to one CB. Attaching CRC bits per CBG degenerates to attaching CRC bits per CB. In the general case, $L_{CBG}$ $L_{CB}$ CRC bits are added to each code block. It is likely, however, that either $L_{CBG}$ or $L_{CB}$ is set to zero for such a case.

If $TBS+L_{TB}+N_{CBG} \cdot L_{CBG} \leq K_{CB,max}+L_{CB}$, code block segmentation is not required, thus $N_{CB}=1$ $K_{CB,1}=TBS+L_{TB}+L_{CBG}$ In the case of no code block segmentation, the code-block group CRC bits may or may not be attached to the transport block.

Particular wireless devices may vary in complexity. The complexity and chip area needed for the LDPC decoder is connected to the maximum codeword length that the hardware is provisioned for. It is therefore likely that different wireless device categories (or UE categories) may have hardware provisioned for different maximum codeword length $N_{max}$. The minimum code rate $R_{min}$ that can be achieved through code extension may also vary between wireless device categories. For example, an mMTC UE may have a high $R_{min}$, while a URLLC UE may have a very low $R_{min}$. These parameters are already accounted for in the code block segmentation embodiments described herein, which makes it simple to apply on different UE categories.

Particular embodiments may include methods in a transmitter. The examples and embodiments described above may be generally represented by the flowchart in FIG. 5.

Figure 5:
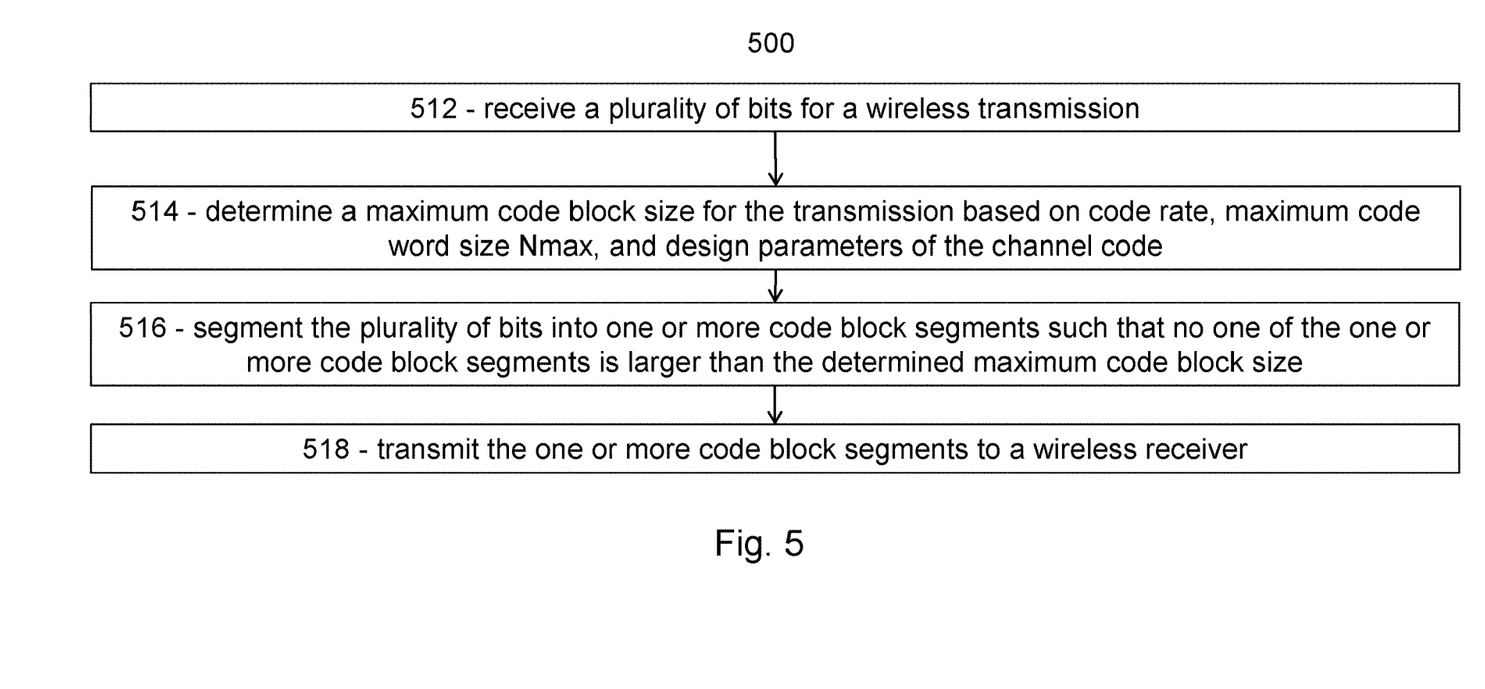
FIG. 5 is a flow diagram illustrating an example method in a wireless transmitter, according to some embodiments.

FIG. 5 is a flow diagram illustrating an example method in a wireless transmitter, according to some embodiments. In particular embodiments, one or more steps of FIG. 5 may be performed by components of wireless network 100 (e.g., network node 120, wireless device 110, etc.) described with respect to FIG. 3.

The method begins at step 512, where the wireless transmitter, such as network node 120 or wireless device 110, receives a plurality of bits for a wireless transmission. For example, a PHY layer of network node 120 may receive information bits from a higher protocol layer for transmission to wireless device 110.

At step 514, the wireless transmitter determines a maximum code block size for the transmission based on code rate, maximum code word size Nmax, and design parameters of the channel code. For example, network node 120 may determine the code block size based on any of the embodiments, examples, and equations described above (e.g., determination of $K_{CB,max}$).

In particular embodiments, the design parameters of the channel code limit the maximum code block size to Kmax for any code rate. In some embodiments, Nmax limits the maximum code block size according to $K_{CB,max}=\max(R_{min}, R)\cdot(N_{max}-N_{sys,punc})-L_{CB}$.

At step 516, the wireless transmitter segments the plurality of bits into one or more code block segments such that no one of the one or more code block segments is larger than the determined maximum code block size. For example, network node 120 may segment the received bits into two code blocks according to any of the embodiments or examples described above (e.g., determination of $N_{CB}$).

In particular embodiments, the segmenting the plurality of bits includes a threshold ΔK for the number of bits with which the TBS+TB-level CRC bits is allowed to exceed the number of code blocks times maximum code block size.

At step 518, the wireless transmitter transmits the one or more code block segments to a wireless receiver. For example, network node 120 may transmit the code block segments to wireless device 110.

Modifications, additions, or omissions may be made to method 500. Additionally, one or more steps in method 500 of FIG. 5 may be performed in parallel or in any suitable order. The steps of method 500 may be repeated over time as necessary.

Figure 6A:
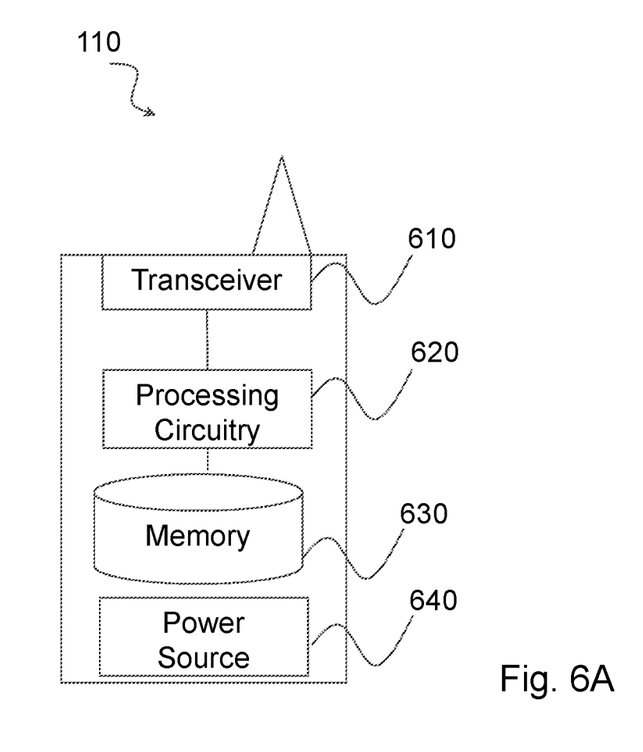
FIG. 6A is a block diagram illustrating an example embodiment of a wireless device.

FIG. 6A is a block diagram illustrating an example embodiment of a wireless device. The wireless device is an example of the wireless devices 110 illustrated in FIG. 3. In particular embodiments, the wireless device is capable of determining a maximum code block size for the transmission based on code rate, maximum code word size Nmax, and design parameters of the channel code. The wireless device may segment a plurality of bits for wireless transmission into one or more code block segments such that no one of the one or more code block segments is larger than the determined maximum code block size.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 610, processing circuitry 620, memory 630, and power source 640. In some embodiments, transceiver 610 facilitates transmitting wireless signals to and receiving wireless signals from wireless network node 120 (e.g., via an antenna), processing circuitry 620 executes instructions to provide some or all of the functionality described herein as provided by the wireless device, and memory 630 stores the instructions executed by processing circuitry 620. Power source 640 supplies electrical power to one or more of the components of wireless device 110, such as transceiver 610, processing circuitry 620, and/or memory 630.

Processing circuitry 620 includes any suitable combination of hardware and software implemented in one or more integrated circuits or modules to execute instructions and manipulate data to perform some or all of the described functions of the wireless device. In some embodiments, processing circuitry 620 may include, for example, one or more computers, one more programmable logic devices, one or more central processing units (CPUs), one or more microprocessors, one or more applications, and/or other logic, and/or any suitable combination of the preceding. Processing circuitry 620 may include analog and/or digital circuitry configured to perform some or all of the described functions of wireless device 110. For example, processing circuitry 620 may include resistors, capacitors, inductors, transistors, diodes, and/or any other suitable circuit components.

Memory 630 is generally operable to store computer executable code and data. Examples of memory 630 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 640 is generally operable to supply electrical power to the components of wireless device 110. Power source 640 may include any suitable type of battery, such as lithium-ion, lithium-air, lithium polymer, nickel cadmium, nickel metal hydride, or any other suitable type of battery for supplying power to a wireless device. In particular embodiments, processing circuitry 620 in communication with transceiver 610 determines a maximum code block size for the transmission based on code rate, maximum code word size Nmax, and design parameters of the channel code; and segments a plurality of bits for wireless transmission into one or more code block segments such that no one of the one more or more code block segments is larger than the determined maximum code block size.

Other embodiments of the wireless device may include additional components (beyond those shown in FIG. 6A) responsible for providing certain aspects of the wireless device's functionality, including any of the functionality described above and/or any additional functionality (including any functionality necessary to support the solution described above).

Figure 6B:
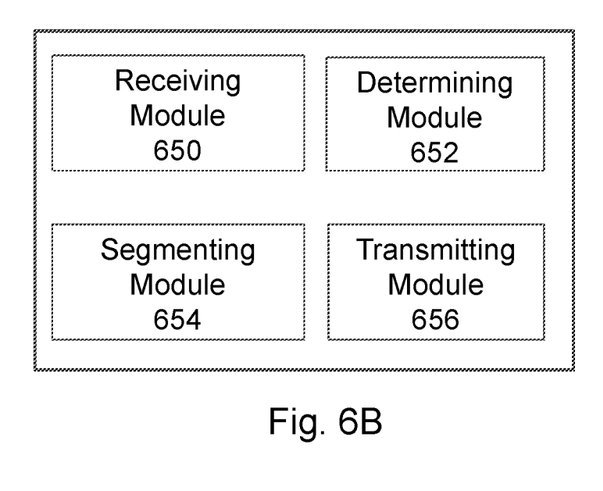
FIG. 6B is a block diagram illustrating example components of a wireless device.

FIG. 6B is a block diagram illustrating example components of a wireless device 110. The components may include receiving module 650, determining module 652, segmenting module 654, and transmitting module 656.

Receiving module 650 may perform the receiving functions of wireless device 110. For example, receiving module 650 may receive a plurality of bits for a wireless transmission, according to any of the examples or embodiments described above (e.g., step 512 of FIG. 5). In certain embodiments, receiving module 650 may include or be included in processing circuitry 620. In particular embodiments, receiving module 650 may communicate with determining module 652, segmenting module 654, and transmitting module 656.

Determining module 652 may perform the determining functions of wireless device 110. For example, determining module 652 may determine a maximum code block size for a transmission based on any of the embodiments or examples described above (e.g., step 514 of FIG. 5). In certain embodiments, determining module 652 may include or be included in processing circuitry 620. In particular embodiments, determining module 652 may communicate with receiving module 650, segmenting module 654, and transmitting module 656.

Segmenting module 654 may perform the segmenting functions of wireless device 110. For example, segmenting module 654 may segment a plurality of bits into one or more code block segments such that no one of the one or more code block segments is larger than the determined maximum code block size, according to any of the examples or embodiments described above (e.g., step 516 of FIG. 5). In certain embodiments, segmenting module 654 may include or be included in processing circuitry 620. In particular embodiments, segmenting module 654 may communicate with receiving module 650, determining module 652, and transmitting module 656.

Transmitting module 656 may perform the transmitting functions of wireless device 110. For example, transmitting module 656 may transmit the one or more code block segments to a wireless receiver, such as network node 120, according to any of the examples or embodiments described above (e.g., step 518 of FIG. 5). In certain embodiments, transmitting module 656 may include or be included in processing circuitry 620. In particular embodiments, transmitting module 656 may communicate with receiving module 650, determining module 652, and segmenting module 654.

Figure 7A:
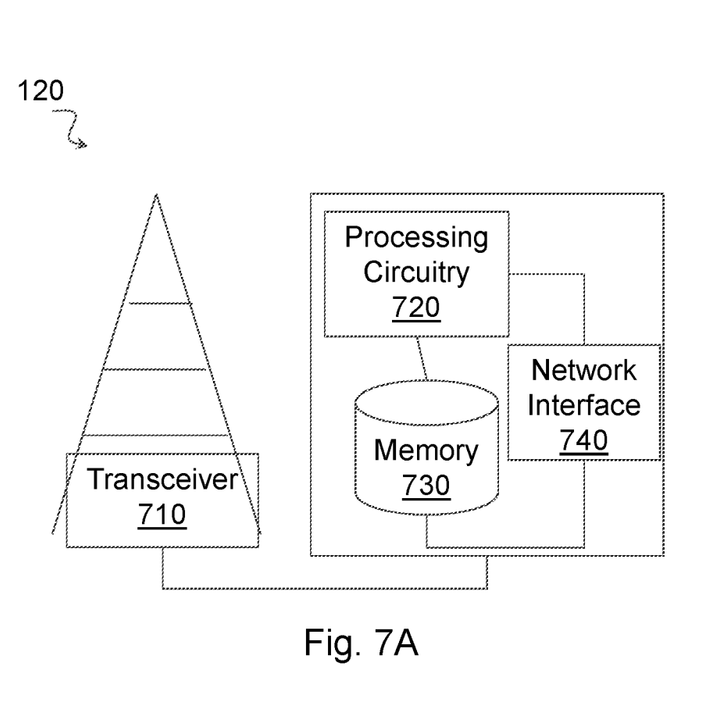
FIG. 7A is a block diagram illustrating an example embodiment of a network node.

FIG. 7A is a block diagram illustrating an example embodiment of a network node. The network node is an example of the network node 120 illustrated in FIG. 3. In particular embodiments, the network node is capable of determining a maximum code block size for the transmission based on code rate, maximum code word size Nmax, and design parameters of the channel code. The network node may segment a plurality of bits for wireless transmission into one or more code block segments such that no one of the one or more code block segments is larger than the determined maximum code block size.

Network node 120 can be an eNodeB, a nodeB, gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 710, processing circuitry 720, at least one memory 730, and at least one network interface 740. Transceiver 710 facilitates transmitting wireless signals to and receiving wireless signals from a wireless device, such as wireless devices 110 (e.g., via an antenna); processing circuitry 720 executes instructions to provide some or all of the functionality described above as being provided by a network node 120; memory 730 stores the instructions executed by processing circuitry 720; and network interface 740 communicates signals to backend network components, such as a gateway, switch, router, Internet, Public Switched Telephone Network (PSTN), controller, and/or other network nodes 120. Processing circuitry 720 and memory 730 can be of the same types as described with respect to processing circuitry 620 and memory 630 of FIG. 6A above.

In some embodiments, network interface 740 is communicatively coupled to processing circuitry 720 and refers to any suitable device operable to receive input for network node 120, send output from network node 120, perform suitable processing of the input or output or both, communicate to other devices, or any combination of the preceding. Network interface 740 includes appropriate hardware (e.g., port, modem, network interface card, etc.) and software, including protocol conversion and data processing capabilities, to communicate through a network. In particular embodiments, processing circuitry 720 in communication with transceiver 710 determines a maximum code block size for the transmission based on code rate, maximum code word size Nmax, and design parameters of the channel code; and segments a plurality of bits for wireless transmission into one or more code block segments such that no one of the one more or more code block segments is larger than the determined maximum code block size.

Other embodiments of network node 120 include additional components (beyond those shown in FIG. 7A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

Figure 7B:
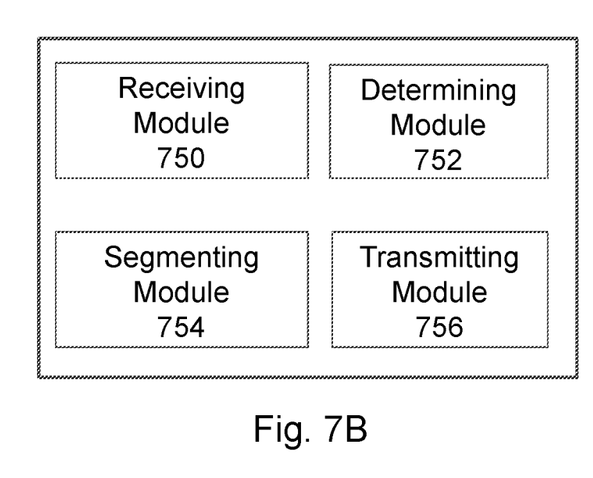
FIG. 7B is a block diagram illustrating example components of a network node.

FIG. 7B is a block diagram illustrating example components of a network node 120. The components may include receiving module 750, determining module 752, segmenting module 754, and transmitting module 756.

Receiving module 750 may perform the receiving functions of network node 120. For example, receiving module 750 may receive a plurality of bits for a wireless transmission, according to any of the examples or embodiments described above (e.g., step 512 of FIG. 5). In certain embodiments, receiving module 750 may include or be included in processing circuitry 720. In particular embodiments, receiving module 750 may communicate with determining module 752, segmenting module 754, and transmitting module 756.

Determining module 752 may perform the determining functions of network node 120. For example, determining module 752 may determine a maximum code block size for a transmission based on any of the embodiments or examples described above (e.g., step 514 of FIG. 5). In certain embodiments, determining module 752 may include or be included in processing circuitry 720. In particular embodiments, determining module 752 may communicate with receiving module 750, segmenting module 754, and transmitting module 756.

Segmenting module 754 may perform the segmenting functions of network node 120. For example, segmenting module 754 may segment a plurality of bits into one or more code block segments such that no one of the one or more code block segments is larger than the determined maximum code block size, according to any of the examples or embodiments described above (e.g., step 516 of FIG. 5). In certain embodiments, segmenting module 754 may include or be included in processing circuitry 720. In particular embodiments, segmenting module 754 may communicate with receiving module 750, determining module 752, and transmitting module 756.

Transmitting module 756 may perform the transmitting functions of network node 120. For example, transmitting module 756 may transmit the one or more code block segments to a wireless receiver, such as wireless device 110, according to any of the examples or embodiments described above (e.g., step 518 of FIG. 5). In certain embodiments, transmitting module 756 may include or be included in processing circuitry 720. In particular embodiments, transmitting module 756 may communicate with receiving module 750, determining module 752, and segmenting module 754.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
BLER Block Error Rate
BTS Base Transceiver Station
CBG Code Block Group
CBS Code Block Segmentation
D2D Device to Device
DL Downlink
eNB eNodeB
FDD Frequency Division Duplex
LDPC low-density Parity Check
LTE Long Term Evolution
M2M Machine to Machine
MCS Modulation and Coding Scheme
MIMO Multi-Input Multi-Output
MTC Machine Type Communication
NR New Radio
OFDM Orthogonal Frequency Division Multiplex
PCM Parity-Check Matrix
PRB Physical Resource Block
RAN Radio Access Network
RAT Radio Access Technology
RB Resource Block
RBS Radio Base Station
RE Resource Element
RNC Radio Network Controller
RRC Radio Resource Control
RRH Remote Radio Head
RRU Remote Radio Unit
SC-FDMA Single Carrier-Frequency Division Multiple Access
TDD Time Division Duplex
TBS Transport Block Size
TTI Transmission Time Interval
UE User Equipment
UL Uplink
URLLC Ultra-Reliable Low Latency Communication
UTRAN Universal Terrestrial Radio Access Network
WAN Wireless Access Network

The invention claimed is:

1. A method in a wireless transmitter, the method comprising:
receiving, at the wireless transmitter, a plurality of bits for a wireless transmission;
determining, at the wireless transmitter, a maximum code block size for the transmission based on code rate, maximum code word size Nmax, and design parameters of the channel code;
segmenting, at the wireless transmitter, the plurality of bits into one or more code block segments such that no one of the one or more code block segments is larger than the determined maximum code block size; and
transmitting, at the wireless transmitter, the one or more code block segments to a wireless receiver.

2. The method of claim 1, wherein the design parameters of the channel code limit the maximum code block size to Kmax for any code rate.

3. The method of claim 1, wherein the determined maximum code block size is limited by code rate and Nmax such that the maximum code block size does not exceed code rate times Nmax.

4. The method of claim 3, wherein the code rate is the maximum of the minimum code rate for which the channel code is designed and the target code rate.

5. The method of claim 3, wherein Nmax is adjusted by subtraction of the number of punctured systematic bits.

6. The method of claim 3, wherein the determined maximum code block size is further adjusted by subtracting the length of the CRC attached to each code block.

7. The method of claim 1, wherein segmenting the plurality of bits further comprises allowing code block segments with a maximum code block size larger than the determined maximum code block size as long as the code block segment size does not exceed Kmax.

8. The method of claim 1, wherein the wireless transmitter comprises a network node.

9. The method of claim 1, wherein the wireless transmitter comprises a wireless device.

10. A wireless transmitter comprising processing circuitry, the processing circuitry operable to:
receive a plurality of bits for a wireless transmission;
determine a maximum code block size for the transmission based on code rate, maximum code word size Nmax, and design parameters of the channel code;

segment the plurality of bits into one or more code block segments such that no one of the one or more code block segments is larger than the determined maximum code block size; and transmit the one or more code block segments to a wireless receiver.

11. The wireless transmitter of claim 10, wherein the design parameters of the channel code limit the maximum code block size to Kmax for any code rate.

12. The wireless transmitter of claim 10, wherein the determined maximum code block size is limited by code rate and Nmax such that the maximum code block size does not exceed code rate times Nmax.

13. The wireless transmitter of claim 12, wherein the code rate is the maximum of the minimum code rate for which the channel code is designed and the target code rate.

14. The wireless transmitter of claim 12, wherein Nmax is adjusted by subtraction of the number of punctured systematic bits.

15. The wireless transmitter of claim 12, wherein the determined maximum code block size is further adjusted by subtracting the length of the CRC attached to each code block.

16. The wireless transmitter of claim 10, wherein the processing circuitry is operable to segment the plurality of bits by allowing code block segments with a maximum code block size larger than the determined maximum code block size as long as the code block segment size does not exceed Kmax.

17. The wireless transmitter of claim 10, wherein the wireless transmitter comprises a network node.

18. The wireless transmitter of claim 10, wherein the wireless transmitter comprises a wireless device.

19. A wireless transmitter comprising a receiving module, a determining module, a segmenting module, and a transmitting module;

the receiving module operable to receive a plurality of bits for a wireless transmission;

the determining module operable to determine a maximum code block size for the transmission based on code rate, maximum code word size Nmax, and design parameters of the channel code;

the segmenting module operable to segment the plurality of bits into one or more code block segments such that no one of the one or more code block segments is larger than the determined maximum code block size; and the transmitting module operable to transmit the one or more code block segments to a wireless receiver.

* * * * *